(12) United States Patent
Huang et al.

(10) Patent No.: US 8,890,178 B2
(45) Date of Patent: Nov. 18, 2014

(54) LIGHT-EMITTING ELEMENT

(75) Inventors: Chien-Fu Huang, Chiayi (TW);
Chao-Hsing Chen, Tainan (TW);
Chiu-Lin Yao, Hsinchu (TW);
Hsin-Mao Liu, Hsinchu (TW);
Chien-Kai Chung, Tainan (TW)

(73) Assignee: Epistar Corporation, Hsinchu (TW)

( * ) Notice: Subject to any disclaimer, the term of this patent is extended or adjusted under 35 U.S.C. 154(b) by 105 days.

(21) Appl. No.: 13/231,250

(22) Filed: Sep. 13, 2011

(65) Prior Publication Data
US 2012/0061667 A1 Mar. 15, 2012

Related U.S. Application Data

(60) Provisional application No. 61/427,462, filed on Dec. 27, 2010, provisional application No. 61/382,461, filed on Sep. 13, 2010.

(51) Int. Cl.
| H01L 29/18 | (2006.01) |
| H01L 27/15 | (2006.01) |
| H01L 33/22 | (2010.01) |
| H01L 33/20 | (2010.01) |
| H01L 33/62 | (2010.01) |

(52) U.S. Cl.
CPC ....... *H01L 27/153* (2013.01); *H01L 2924/0002* (2013.01); *H01L 33/22* (2013.01); *H01L 33/20* (2013.01); *H01L 33/62* (2013.01)
USPC ........................ 257/88; 457/43; 457/E33.028

(58) Field of Classification Search
USPC ................... 257/79–103, E33.005, E33.006, 257/E33.012, E33.028, E33.065, E33.072, 257/E33.073
See application file for complete search history.

(56) References Cited

U.S. PATENT DOCUMENTS

2010/0123147 A1* 5/2010 Jeong .............................. 257/94

\* cited by examiner

*Primary Examiner* — Tucker Wright
(74) *Attorney, Agent, or Firm* — Muncy, Geissler, Olds & Lowe, P.C.

(57) ABSTRACT

A light-emitting element includes a monolithic understructure including a first surface and a second surface different from the first surface; a plurality of light-emitting structure units disposed on the second surface; and a trench formed on a portion of the first surface and between the plurality of light-emitting structure units, wherein a height of the portion of the first surface is greater than a height of the second surface measured from a bottom of the monolithic understructure, and the portion of the first surface is exposed by the trench.

16 Claims, 7 Drawing Sheets

LIGHT-EMITTING ELEMENT

RELATED APPLICATION

This application claims the benefits of provisional application No. 61/427,462 filed on Dec. 27, 2010 and provisional application No. 61/382,461 filed on Sep. 13, 2010; the contents of which are incorporated herein by reference in their entireties.

TECHNICAL FIELD

The application relates to a light-emitting element and the manufacturing method thereof.

DESCRIPTION OF BACKGROUND ART

The light radiation theory of light emitting diode (LED) is to generate light from the energy released by the electron moving between the n-type semiconductor and the p-type semiconductor. Because the light radiation theory of LED is different from the incandescent light which heats the filament, the LED is called a "cold" light source.

Moreover, the LED is more sustainable, longevous, light and handy, and less power consumption, therefore it is considered as a new light source for the illumination markets. The LED applies to various applications like the traffic signal, backlight module, street light, and medical instruments, and is gradually replacing the traditional lighting sources.

SUMMARY OF THE DISCLOSURE

A light-emitting element includes a monolithic understructure including a first surface and a second surface different from the first surface; a plurality of light-emitting structure units disposed on the second surface; and a trench formed on a portion of the first surface and between the plurality of light-emitting structure units, wherein a height of the portion of the first surface is greater than a height of the second surface measured from a bottom of the monolithic understructure, and the portion of the first surface is exposed by the trench.

A light-emitting element includes an understructure comprising a first surface and a second surface different from the first surface; a plurality of light-emitting structure units disposed on the second surface; and a trench formed on the first surface and between the plurality of light-emitting structure units, wherein the first surface comprises one first protrusion, the second surface comprises a plurality of second protrusions, and the plurality of second protrusions is covered by one of the light-emitting structure units, and wherein a height of the first protrusion is greater than an average height of the plurality of second protrusions.

DETAILED DESCRIPTION OF PREFERRED EMBODIMENTS

Figure 1A:
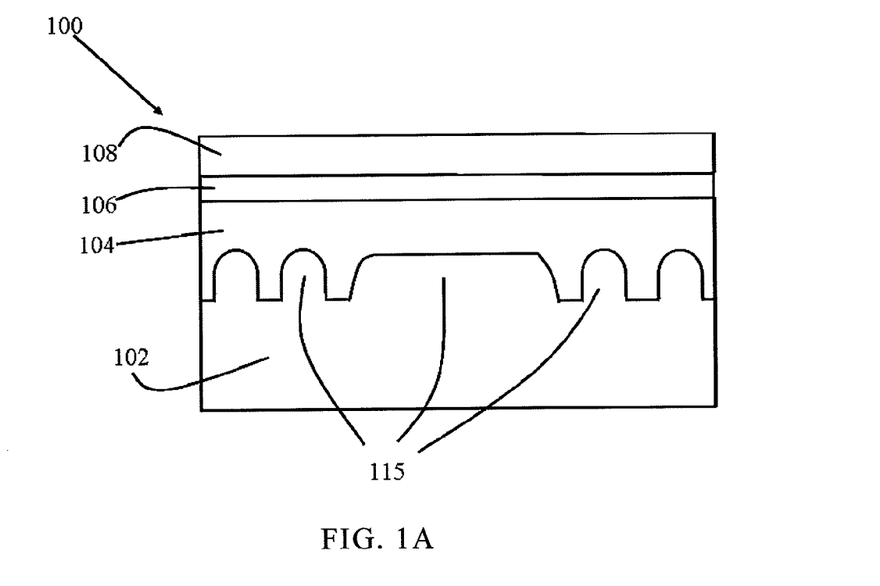
FIGS. 1A to 1C are cross-sectional views of a light-emitting structure in accordance with a first embodiment of the present application.
Figure 1B:
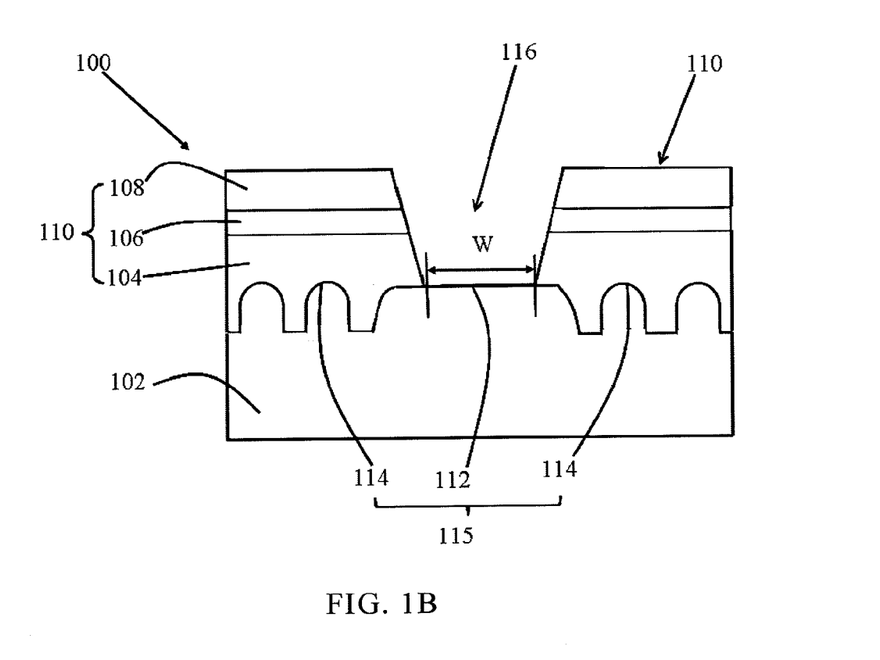

FIGS. 1A and 1B illustrate a method of making a light-emitting structure in accordance with a first embodiment of the present application. The light-emitting structure 100 includes an understructure 102, a lower layer 104, an upper layer 108, and a light-emitting zone 106. The light-emitting zone 106 can emit light when a forward bias voltage (not shown) is applied to the upper layer 108 and the lower layer 104. The understructure 102, having an area equal to or smaller than 100 mil×100 mil in the embodiment, can be used to support or grow the lower layer 104, the light-emitting zone 106, and/or the upper layer 108. To change the direction of light moving backwards to the understructure 102 and enhance the forward light output, a textured structure 115 can be constructed below the light-emitting zone 106 to reflect and/or scatter light.

Specifically, the textured structure 115 provided below the light-emitting zone 106 can be formed on the top surface of the understructure 102. The textured structure 115 can be also formed on a buffer layer, bonding layer or reflective layer between the understructure 102 and the light-emitting zone 106, and the material of the buffer layer, bonding layer or reflective layer include inorganic material and/or organic material. The inorganic material includes but is not limited to conductive material, insulating material, and high-dissipation material. The conductive material includes but is not limited to metal and semiconductor like nitride-series material and phosphide-series material. The insulating material includes but is not limited to glass, silicon dioxide, and sapphire. The high-dissipation material includes but is not limited to diamond-like carbon and graphite. The textured structure 115 can be formed by processes including masking, lithographing, wet etching, or dry etching. The textured structure 115 can be formed in a regular pattern or irregular pattern. The regular pattern can include but is not limited to constantly periodical features, variable periodical features, and quasi-periodical features. The irregular pattern can include but is not limited to random features. The individual feature of the textured structure 115 can be formed in a shape including but not limited to hemisphere, trapezoid, reversed-trapezoid, cone, pyramid, and any combination thereof.

As shown in FIG. 1B, the light-emitting structure 100 is divided into two or more light-emitting structure units 110 by forming one or more trenches 116 in-between. Each light-emitting structure unit 110 is formed on the understructure 102, and the light-emitting structure unit 110 can be used for emitting light or other purpose. In one embodiment, the textured structure 115 under the light-emitting structure units 110 and the trench 116 can be divided into a first surface 112, and a plurality of second surfaces 114. The first surface 112 and the second surfaces 114 have different textured features. For example, the first surface 112 has a textured feature such as a protrusion in any geometric shape, which can be wider, higher, or longer than the other textured feature(s) of the second surfaces 114. In the embodiment, the first surface 112 has a substantially constant height, and the height of the protrusion thereof is about 1.5 μm and is the same as that of the protrusions of the second surfaces 114. The width of the protrusion of the first surface 112 is between 3~15 μm, and the width of each of the protrusions of the second surfaces 114 is between 1~2 μm. The light-emitting structure units 110 can be formed on the second surfaces 114 respectively, and the trench 116 can be formed on the first surface 112. The trench 116 has a bottom end directly on the first surface 112, and the bottom end has a width between 3~10 μm. In addition, the light-emitting structure units 110 can also cover part of the first surface 112 as shown in FIG. 1B.

The first surface 112 has a width greater than a shortest width W of the bottom end of the trench 116 as shown in the drawing. However, the first surface 112 can also be configured to be smaller than or fit into the shortest width W. The volume of the trench 116 depends on the elevation of the first surface 112, and the higher the first surface 112 is the smaller the volume of the trench 116 is. The smaller volume of the trench 116 requires less material for overlaying or filling the trench 116. Provided the first surface 112 has an elevation higher than that of the second surfaces 114, the benefit is even remarkable. For example, an insulating material (not shown) filling the trench 116 can have a smaller volume and/or a conductive structure (not shown) overlaying the isolation material can have a shorter length.

Each of the lower layer 104, the upper layer 108, and the light-emitting zone 106 can be composed of materials such as the series of aluminum gallium indium phosphide (AlGaInP), the series of aluminum gallium indium nitride (AlGaInN), and/or the series of zinc oxide (ZnO). The light-emitting zone 106 can be configured to be a single heterostructure (SH), a double heterostructure (DH), a double-side double heterostructure (DDH), or a multi-quantum well (MQW). Besides, the wavelength of the emitted light can also be adjusted by changing the number of the pairs of the quantum well.

The material of the understructure 102 used for growing or supporting the lower layer, the light-emitting zone, and/or the upper layer can include but is not limited to semiconductor such as gallium arsenide (GaAs), indium phosphide (InP), silicon (Si), aluminum nitride (AlN) and gallium nitride (GaN), metal such as germanium (Ge), metal oxide such as lithium aluminum oxide (LiAlO$_2$) and zinc oxide (ZnO), transparent material such as sapphire, diamond, silicon carbide (SiC), and glass, high-dissipation material such as diamond-like carbon (DLC) and CVD diamond, composite such as Metal Matrix Composite (MMC), and Polymer Matrix Composite (PMC), and any combination thereof.

Figure 1C:
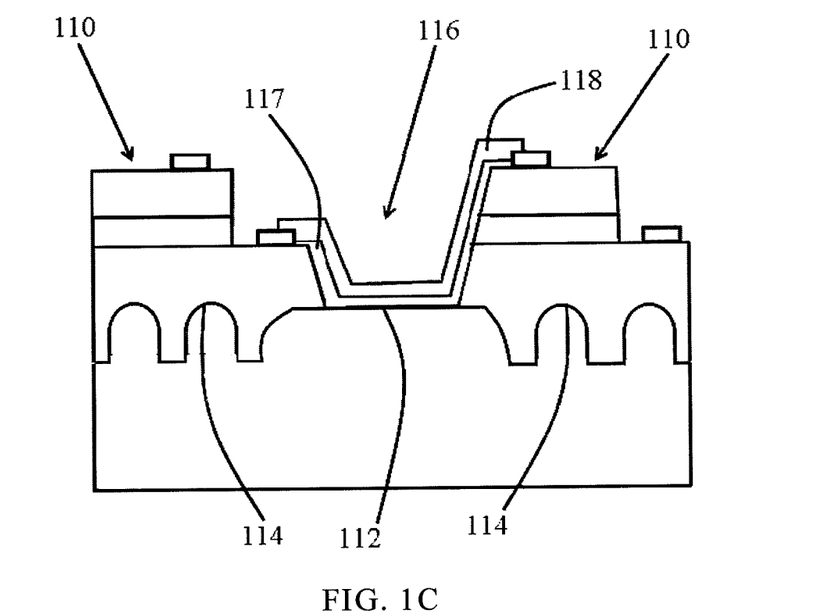

Referring to FIG. 1C, in the embodiment, a light-emitting structure of the aluminum gallium indium nitride series material can be epitaxially formed on or bonded to the understructure 102 such as a sapphire substrate having a first surface 112 and the second surfaces 114. After connecting the light-emitting structure with the understructure 102, a trench 116 over or on the first surface 112 can be further created by removing a portion of the light-emitting structure. Moreover, an insulating material 117 and a conductive structure 118 are sequentially formed on the trench 116 to electrically bridge two light-emitting structure units 110 separated by the trench 116. The insulating material 117 can be SiO$_2$, BCB, SOG, and silicone. The conductive structure 118 can be a metallic structure, oxide material structure, and semiconductor structure.

Each light-emitting structure unit 110 can emit light or can be used as a bonding pad or a circuit node.

Figure 2:
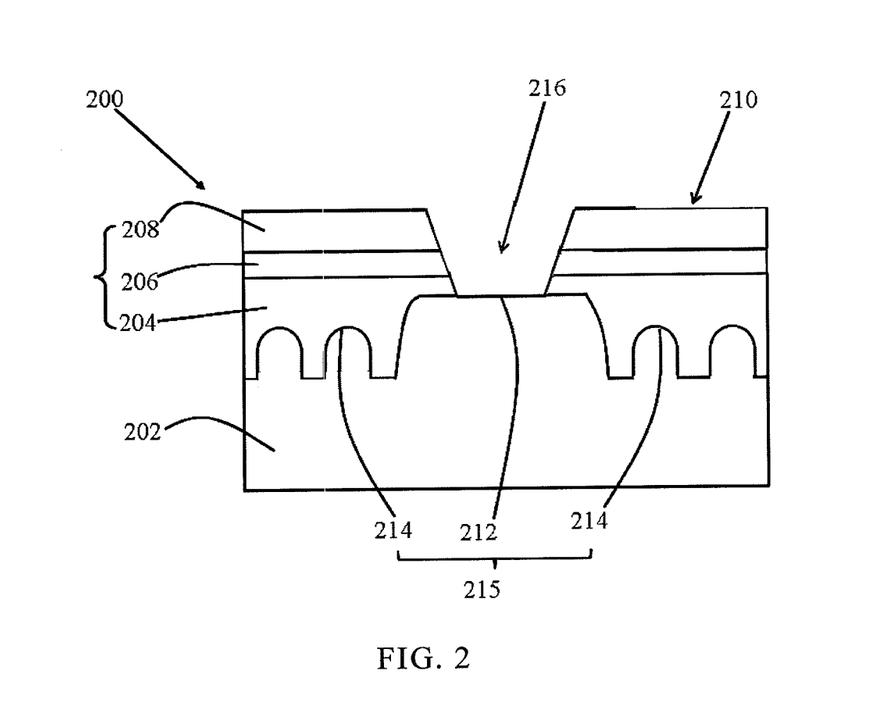
FIG. 2 is a cross-sectional view a light-emitting structure in accordance with a second embodiment of the present application.

As shown in FIG. 2, a light-emitting structure in accordance with a second embodiment of the present application is disclosed. The light-emitting structure 200 is divided into two or more light-emitting structure units 210 by forming one or more trenches 216 in-between. Each of the light-emitting structure units 210 is formed on an understructure 202 and includes a lower layer 204, an upper layer 208, and a light-emitting zone 206. The light-emitting zone 206 can emit light when a forward bias voltage (not shown) is applied to the upper layer 208 and the lower layer 204. The understructure 202 can be used to support or grow the lower layer 204, the light-emitting zone 206, and/or the upper layer 208. To change the direction of light moving backwards to the understructure 202 and enhance the forward light output, a textured structure 215 including a first surface 212, a plurality of second surfaces 214 can be constructed below the light-emitting zone 206 to reflect and/or scatter light. In the embodiment, the first surface 212 has a protrusion wider and higher than that of the second surfaces 214. The height of the protrusion of the first surface 212 can be greater than 1.5 μm.

Figure 3:
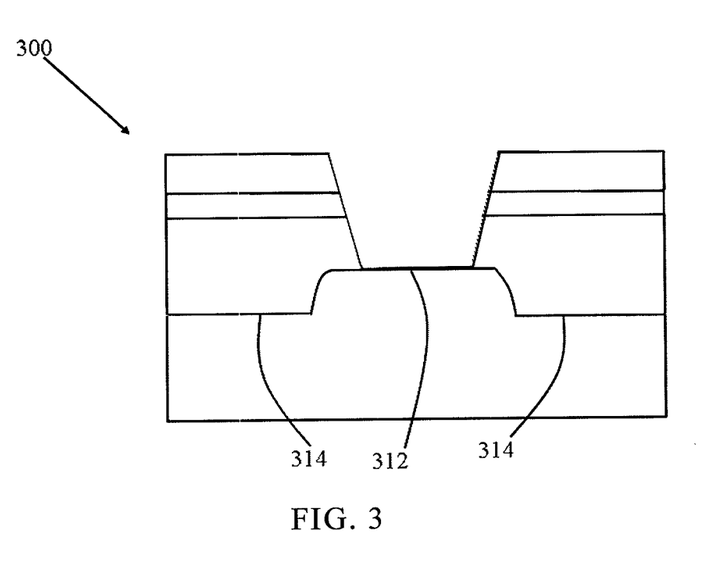
FIG. 3 is a cross-sectional view a light-emitting structure in accordance with a third embodiment of the present application.

As shown in FIG. 3, in a third embodiment of the present application, the light-emitting structure 300 includes an understructure 302 having a first surface 312 and a plurality of second surfaces 314. The difference between the embodiment and prior embodiments is that there is no protrusion on the second surfaces 314, and each of the second surfaces is flat surface.

Figure 4A:
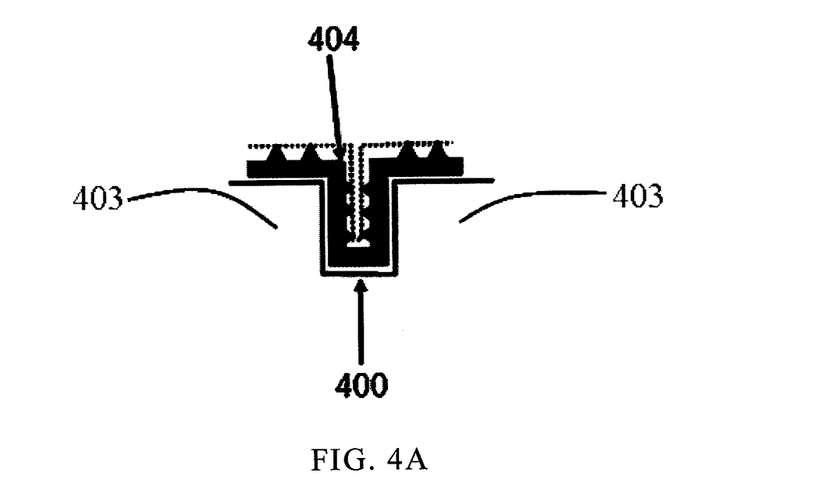
FIGS. 4A and 4B illustrate a process of forming a conductive structure in a trench between light-emitting structure units in accordance with a forth embodiment of the present application.
Figure 4B:
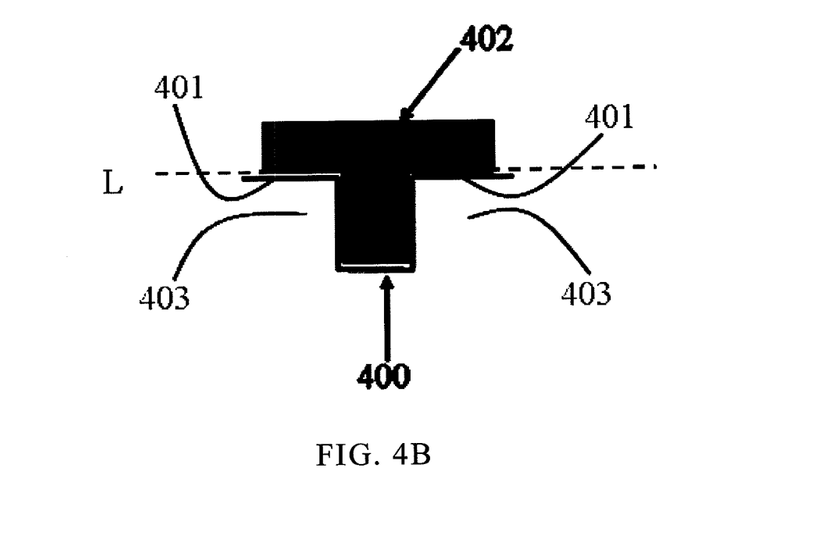

Referring to FIGS. 4A and 4B, another forming process of the conductive structure of aforesaid embodiments is disclosed. FIGS. 4A and 4B illustrate a conductive structure 402 formed on a trench 400 between light-emitting structure units 403 in accordance with a forth embodiment of the present application. The electrical connection 402 is formed by electroplating. Specifically, a seed layer 404 is formed on the trench 400 before the electroplating is performed. The conductive structure 402 in the trench 400 can be used for electrical connection, and an insulating material (not shown) can be laid on a predetermined area where the seed layer 404 for the electroplating is not introduced. In another embodiment, the conductive structure 402 is formed by electro-less plating. The electro-less plating is carried out without applying external voltage. In the presence of the chemical reaction between the metal ions of the electrolyte and the deposited article (for example, the seed layer), the metal ions are reduced into solid metal and deposited on the surface of the deposited article. The reduction of the metal ions occurs only on the deposited article, therefore, most of the consumed electrolyte is used to form metal layer in the specific area. To make the conductive structure 402 over the trench 400 robust, the plating material can fill all or most of the trench 400; even exceeds the upmost boundary L of the trench 400 to form a thick layer of the plating material on the light-emitting structure units 403 next to the trench 400 as shown in FIG. 4B.

Figure 5:
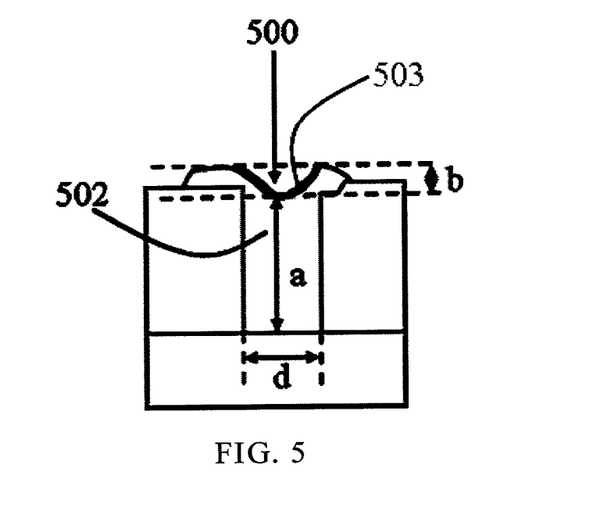
FIG. 5 illustrates an insulating material filled in a trench between light-emitting structure units in accordance with a fifth embodiment of the present application.

FIG. 5 illustrates an insulating material filled in the trench between light-emitting structure units of aforementioned embodiments. Specifically, the insulating material 502 in the trench 500 is filled and planarized by SOG reflow. The upper surface of the insulting material 502 may have a sink portion 503 resulted from the SOG reflow. As depicted in the drawing, the distance from the bottom of the trench 500 to the lowest point of the sink portion 503 is "a", the width or diameter of the trench 500 is "d", and the largest depth (from the topmost point to the lowest point) of the sink portion 503 of the insulating material 502 is "b". The ratio of b/a is controlled under 0.05 by adjusting the parameters of the SOG reflow process, therefore a relative flat plane can be achieved for laying the conductive structure described in the aforementioned embodiments.

Figure 6:
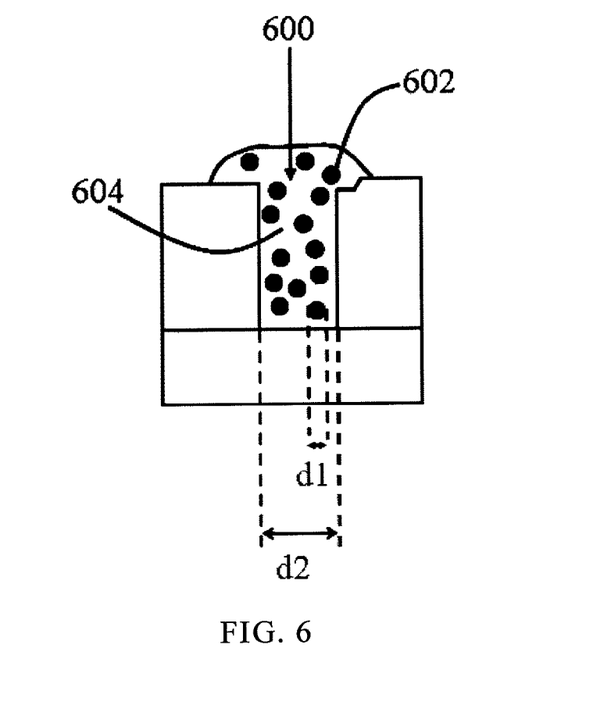
FIG. 6 illustrates an insulating material filled in a trench between light-emitting structure units in accordance with a sixth embodiment of the present application.

FIG. 6 illustrates an insulating material filled in the trench between light-emitting structure units of aforementioned embodiments. Specifically, the trench 600 is filled with reinforcement material 602 and insulating material 604. The reinforcement material 602 can be firstly placed in the trench 600, and the insulating material 604 is then filled the gaps remaining in the trench 600. Alternatively, the reinforcement material 602 can be blended with the insulating material 604 before filling into the trench 600. The reinforcement material 602 is facilitated to support the filling material 604 and avoid a sink portion such as in FIG. 5 from appearing on the opening of the trench 600. The reinforcement material 602 has at least one exterior dimension, such as the width d1, smaller than the width d2 of the opening of the trench 600. The reinforcement material 602 can be chosen from several materials such as organic material, inorganic material, and fluorescent material. The organic material includes but is not limited to silicone, epoxy, polyimide, and PMMA. The inorganic material includes but is not limited to glass, diamond, diamond-like carbon (DLC), PVC diamond, and $SiO_2$. The fluorescent material includes but is not limited to phosphor and dye. The reinforcement material 602 can be fiber, particulate, flake, or laminate.

Figure 7A:
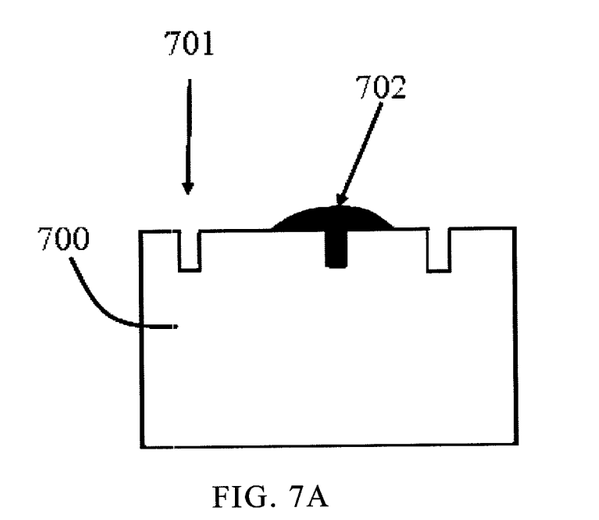
FIGS. 7A to 7D illustrate a process of filling an insulating material in the trenches between light-emitting structure units in accordance with a seventh embodiment of the present application.
Figure 7B:
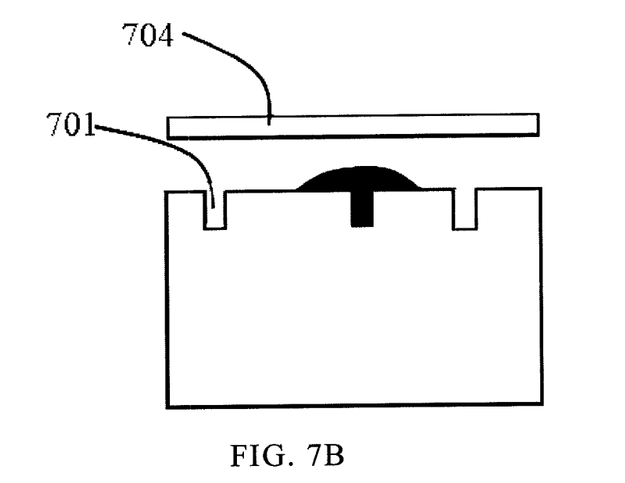
Figure 7C:
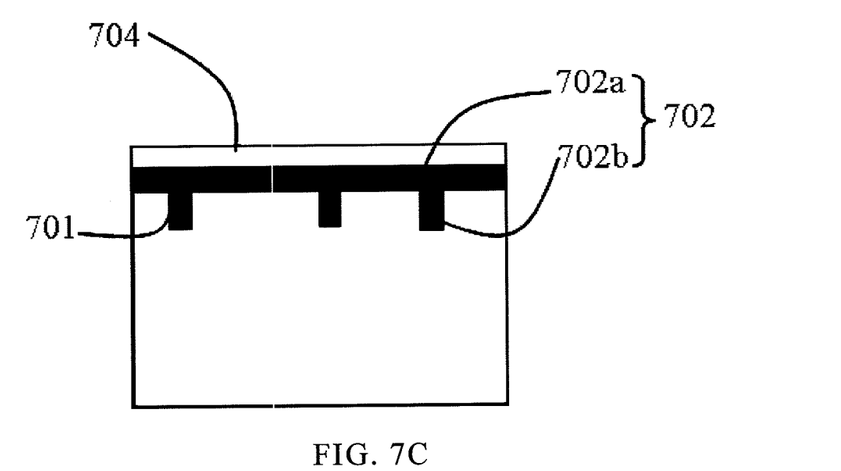
Figure 7D:
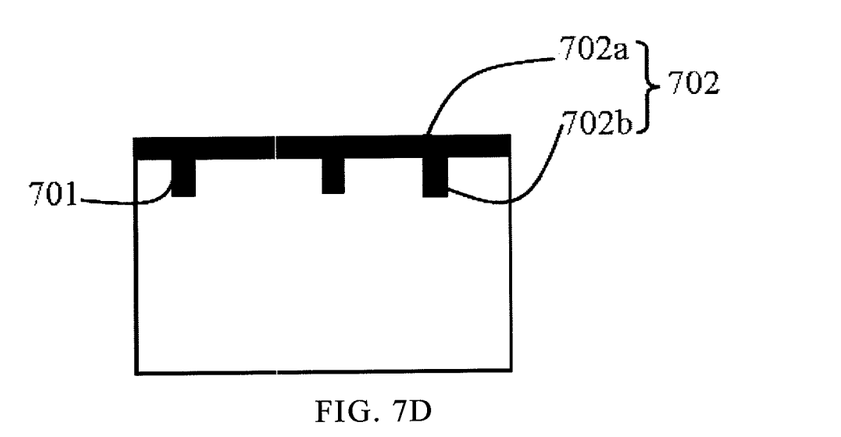

FIGS. 7A to 7D illustrate a process of filling an insulating material in the trenches between light-emitting structure units of aforementioned embodiments. In step (1), an insulating material 702 such as a foam material is applied to one or more trenches 701 and the light-emitting structure unit(s) 700. In steps (2)~(4), a plate 704 is provided to squeeze the insulating material 702 into the trenches 701. The trench 701 can be fully or partially filled with the insulating material 702. However, in practice, one or more voids (not shown), such as air bubbles, can still exist within the insulating material 702. Provided an adequate volume of the insulating material 702 is supplied, an insulating layer 702a with protrusions 702b entering the trenches 701 can be formed between the plate 704 and the light-emitting structure unit 700 as shown in FIGS. 7C and 7D. In addition, the foam material layer 702a can be further removed to leave the foam material 702 filling the trenches 701.

In accordance with one embodiment of the present application, the light-emitting structure unit 700 can include at least a first conductivity layer (for example, the upper layer), a conversion unit (for example, the light-emitting zone), and a second conductivity layer (for example, the lower layer). Each of the first conductivity layer and the second conductivity layer has a single layer or a group of multiple layers ("multiple layers" means two or more layers), and the two single layers or the two groups of the multiple layers, which are respectively located on the first and the second conductivity layers, have distinct polarities or distinct dopants. For example, the first conductivity layer is a p-type semiconductor layer; the second conductivity layer is an n-type semiconductor layer. The conversion unit disposed between the first conductivity layer and the second conductivity layer is a region where the light energy and the electrical energy could be transferred or induced to transfer. The one that the electrical energy can be transferred to the light energy is such as a light-emitting diode, a liquid crystal display, and an organic light-emitting diode. The one that the light energy can be transferred to the electrical energy is such as a solar cell, and an optoelectronic diode.

The transferred light emission spectrum of the light-emitting diode can be controlled by changing the physical or chemical arrangement of one layer or more layers in the light-emitting diode. The light-emitting diode can be composed of several materials, such as the series of aluminum gallium indium phosphide (AlGaInP), the series of aluminum gallium indium nitride (AlGaInN), and/or the series of zinc oxide (ZnO). The light-emitting zone 106 can be configured to be a single heterostructure (SH), a double heterostructure (DH), a double-side double heterostructure (DDH), or a multi-quantum well (MQW). Besides, the wavelength of the emitted light can also be adjusted by changing the number of the pairs of the quantum well.

Although the present application has been explained above, it is not the limitation of the range, the sequence in practice, the material in practice, or the method in practice. Any modification or decoration for present application is not detached from the spirit and the range of such.

What is claimed is:

1. A light-emitting element comprising:
a monolithic understructure comprising a first surface and a second surface different from the first surface;
a plurality of light-emitting structure units disposed on the second surface; and
a trench formed on a portion of the first surface and between the plurality of light emitting structure units,
wherein a height of the portion of the first surface is greater than a height of the second surface measured from a bottom of the monolithic understructure, and the portion of the first surface is exposed by the trench.

2. The light-emitting element according to claim 1, wherein the first surface comprises a substantially constant height.

3. The light-emitting element according to claim 1, wherein the first surface comprises one first protrusion.

4. The light-emitting element according to claim 3, wherein the second surface comprises a plurality of second protrusions.

5. The light-emitting element according to claim 3, wherein a width of the first protrusion is between 3~15 μm.

6. The light-emitting element according to claim 3, wherein the trench comprises a bottom that reaches the first protrusion, and a width of the first protrusion is greater than a shortest width of the bottom of the trench.

7. The light-emitting element according to claim 6, wherein the width of the bottom of the trench is between 3~10 μm.

8. The light-emitting element according to claim 4, wherein an average width of the first protrusion is greater than that of the plurality of second protrusions.

9. The light-emitting element according to claim 4, wherein the width of each of the second protrusions is between 1~2 μm.

10. The light-emitting element according to claim 4, wherein an average height of the plurality of second protrusions is about 1.5 μm.

11. The light-emitting element according to claim 1, further comprising a plurality of conductive structures connected between the plurality of light-emitting structure units.

12. The light-emitting element according to claim 11, further comprising a plurality of insulating material between the conductive structures and the light-emitting structure units.

13. The light-emitting element according to claim 1, wherein the light-emitting element is a chip with a substrate area equal to or smaller than 100 mil×100 mil.

14. The light-emitting element according to claim 1, wherein each of the light-emitting structure units comprises an upper layer, a lower layer, and a light-emitting zone formed between the upper layer and the lower layer.

15. The light-emitting element according to claim 14, wherein the material of each of the lower layer, the upper layer, and the light-emitting zone comprises the AlGaInP-based materials, AlGaInN-based materials, and/or the series of ZnO.

16. A light-emitting element comprising:
- an understructure comprising a first surface and a second surface different from the first surface;
- a plurality of light-emitting structure units disposed on the second surface; and
- a trench formed on the first surface and between the plurality of light-emitting structure units,
- wherein the first surface comprises one first protrusion, the second surface comprises a plurality of second protrusions, and the plurality of second protrusions is covered by one of the light-emitting structure units, and
- wherein a height of the first protrusion is greater than an average height of the plurality of second protrusions.

* * * * *